US008849187B2

(12) United States Patent
Van Buren et al.

(10) Patent No.: US 8,849,187 B2
(45) Date of Patent: Sep. 30, 2014

(54) RADIO FREQUENCY AMPLIFIER NOISE REDUCTION SYSTEM

(75) Inventors: Vernon A. Van Buren, Cedar City, UT (US); Patrick L. Cook, St. George, UT (US); Christopher K. Ashworth, St. George, UT (US); Richard M. Kline, Cedar City, UT (US)

(73) Assignee: Wilson Electronics, LLC, St. George, UT (US)

( * ) Notice: Subject to any disclaimer, the term of this patent is extended or adjusted under 35 U.S.C. 154(b) by 0 days.

(21) Appl. No.: 13/592,079

(22) Filed: Aug. 22, 2012

(65) Prior Publication Data

US 2013/0084906 A1 Apr. 4, 2013

Related U.S. Application Data (60) Provisional application No. 61/526,448, filed on Aug. 23, 2011.

(51) Int. Cl.
*H04B 3/36* (2006.01)
*H04B 7/14* (2006.01)
(Continued)

(52) U.S. Cl.
CPC .......... *H04W 52/52* (2013.01); *H03F 2200/405* (2013.01); *H03F 2200/321* (2013.01); *H03F 2200/411* (2013.01); *H03F 3/189* (2013.01); *H04W 52/00* (2013.01); *H03F 1/0261* (2013.01); *H03F 3/72* (2013.01)
USPC .................. 455/7; 455/11.1; 455/15; 455/24; 455/226.2; 330/149; 370/279; 370/315; 375/211; 375/296

(58) Field of Classification Search
CPC ........... H04B 7/15542; H04B 7/15564; H04B 7/15578; H04B 7/15535; H04B 1/0475; H04B 2001/0425; H04B 7/0413; H04B 7/0465; H04B 7/1555; H04B 7/15557; H04B 7/15585; H04B 7/2606; H04B 7/155; H03G 3/20; H03G 3/3036; H03G 3/3042; H03G 3/001; H04W 52/00; H04W 52/24; H04W 52/50; H04W 84/042; H04W 84/047; H04W 84/12; H04W 88/04; H04W 88/06; H04W 88/08; H04W 88/085; H04W 24/00; H04W 24/08; H04W 52/367; H04W 72/04; H04W 76/02; H04W 84/08; H04W 88/02; H03F 1/0222; H03F 1/3247; H03F 1/3241; H03F 1/3229; H03F 2200/102
USPC ................. 455/7, 9, 10, 11.1, 69, 127.1, 136, 455/226.2, 232.1, 240.1, 250.1, 422.1, 423, 455/450, 522, 550.1, 571; 370/282, 315, 370/318, 232, 277, 279, 329, 334, 335, 370/536; 375/295, 296, 297, 345, 143, 211, 375/260, 267, 340, 350, 376; 330/136, 149, 330/279

See application file for complete search history.

(56) References Cited

U.S. PATENT DOCUMENTS 4,539,527 A 9/1985 Ishigaki et al.
4,595,803 A 6/1986 Wright
(Continued)

OTHER PUBLICATIONS

U.S. Appl. No. 13/439,148, filed Apr. 4, 2012, Van Buren et al.
(Continued)

*Primary Examiner* — Yuwen Pan
*Assistant Examiner* — Paul P Tran
(74) *Attorney, Agent, or Firm* — Maschoff Brennan (57) ABSTRACT

An amplifier for controlling or reducing broadband noise is disclosed. An amplifier determines whether a useful signal is being amplified and controls the gain of the amplifier at least when useful signals are not being amplified to prevent or minimize the amplification of noise.

4 Claims, 4 Drawing Sheets

(51) Int. Cl.

| | |
|---|---|
| *H04B 7/15* | (2006.01) |
| *H04B 17/00* | (2006.01) |
| *H03F 1/26* | (2006.01) |
| *H03F 1/30* | (2006.01) |
| *H04J 1/10* | (2006.01) |
| *H04J 3/08* | (2006.01) |
| *H04B 7/17* | (2006.01) |
| *H04B 17/02* | (2006.01) |
| *H04L 25/20* | (2006.01) |
| *H04L 25/52* | (2006.01) |
| *H04W 52/52* | (2009.01) |
| *H03F 3/189* | (2006.01) |
| *H04W 52/00* | (2009.01) |
| *H03F 1/02* | (2006.01) |
| *H03F 3/72* | (2006.01) |

(56) References Cited

U.S. PATENT DOCUMENTS

| | | | |
|---|---|---|---|
| 4,731,869 A | 3/1988 | Farrer | |
| 5,095,528 A | 3/1992 | Leslie et al. | |
| 5,585,762 A * | 12/1996 | Dekker | 330/144 |
| 5,787,336 A | 7/1998 | Hirschfield et al. | |
| 5,815,795 A | 9/1998 | Iwai | |
| 5,835,848 A * | 11/1998 | Bi et al. | 455/24 |
| 6,384,681 B1 | 5/2002 | Bonds | |
| 6,584,081 B1 | 6/2003 | Lee et al. | |
| 6,892,080 B2 * | 5/2005 | Friesen et al. | 455/571 |
| 7,085,330 B1 * | 8/2006 | Shirali | 375/296 |
| 7,184,703 B1 | 2/2007 | Naden et al. | |
| 7,233,771 B2 | 6/2007 | Proctor, Jr. et al. | |
| 7,245,880 B1 | 7/2007 | Jacobsen | |
| 7,382,835 B2 * | 6/2008 | Anvari | 375/297 |
| 7,409,186 B2 * | 8/2008 | Van Buren et al. | 455/10 |
| 7,613,232 B2 * | 11/2009 | Meir et al. | 375/211 |
| 7,620,380 B2 | 11/2009 | Hendrix et al. | |
| 8,233,520 B2 * | 7/2012 | Wong | 375/219 |
| 2002/0101936 A1 | 8/2002 | Wright et al. | |
| 2003/0100351 A1 * | 5/2003 | Friesen et al. | 455/571 |
| 2003/0123401 A1 | 7/2003 | Dean | |
| 2003/0124997 A1 | 7/2003 | Park | |
| 2003/0211828 A1 | 11/2003 | Dalgleish et al. | |
| 2004/0146013 A1 | 7/2004 | Song et al. | |
| 2004/0166802 A1 | 8/2004 | McKay et al. | |
| 2004/0229586 A1 | 11/2004 | Oshima et al. | |
| 2005/0272367 A1 | 12/2005 | Rodgers et al. | |
| 2006/0091950 A1 * | 5/2006 | Hayase | 330/149 |
| 2006/0209997 A1 | 9/2006 | Van Buren et al. | |
| 2007/0071128 A1 | 3/2007 | Meir et al. | |
| 2007/0197207 A1 | 8/2007 | Carstens et al. | |
| 2007/0268827 A1 | 11/2007 | Csaszar et al. | |
| 2008/0014862 A1 | 1/2008 | Van Buren et al. | |
| 2008/0076437 A1 | 3/2008 | Wilson et al. | |
| 2008/0212500 A1 | 9/2008 | Zhen et al. | |
| 2008/0293370 A1 | 11/2008 | Wood | |
| 2008/0304434 A1 | 12/2008 | Giaretta et al. | |
| 2009/0311985 A1 | 12/2009 | Youssoufian et al. | |
| 2010/0009646 A1 | 1/2010 | Mevel et al. | |
| 2010/0093388 A1 | 4/2010 | Bagchi | |
| 2010/0153049 A1 * | 6/2010 | Ventola et al. | 702/86 |
| 2010/0159856 A1 * | 6/2010 | Kato et al. | 455/114.3 |
| 2010/0248751 A1 * | 9/2010 | Tsutsui | 455/458 |
| 2010/0321219 A1 | 12/2010 | Li | |
| 2011/0105060 A1 | 5/2011 | Kim et al. | |
| 2011/0190028 A1 | 8/2011 | Hahn et al. | |
| 2011/0217943 A1 | 9/2011 | Ashworth et al. | |

OTHER PUBLICATIONS

U.S. Appl. No. 13/593,246, filed Aug. 23, 2012, Van Buren et al.
U.S. Appl. No. 11/457,406, mailed Feb. 21, 2008, Office Action.
U.S. Appl. No. 11/457,406, mailed May 23, 2008, Notice of Allowance.
U.S. Appl. No. 13/040,125, mailed Jun. 8, 2012, Office Action.
International Search Report & Written Opinion dated Nov. 6, 2012 as received in application No. PCT/US2012/052144.
International Search Report & Written Opinion dated Nov. 2, 2012 as received in application No. PCT/US2012/052155.

* cited by examiner

RADIO FREQUENCY AMPLIFIER NOISE REDUCTION SYSTEM

CROSS-REFERENCE TO RELATED APPLICATIONS

This application claims the benefit of U.S. Provisional Application Ser. No. 61/526,448 filed on Aug. 23, 2011. The foregoing application is incorporated by reference in its entirety.

BACKGROUND

Booster amplifiers are bi-directional amplifiers used for increasing the sensitivity and power output of cell phones and other devices that are communicating through them. The use of a booster amplifier, however, may disrupt cellular systems of both the network through which the device is communicating and other cellular networks that the device is not communicating through.

The potentially adverse effects of a booster amplifier can result in situations where other devices are dropped or disconnected or in situations that interfere with the operation of base stations in a wireless network. A booster amplifier, for example, can increase the noise floor, which decreases the sensitivity of a base station. Increasing the noise floor often decreases the coverage area of a base station and impairs cellular service.

For example, an amplifier generates amplified thermal noise even when no input signal is present or when the amplifier is idle. In high gain RF (Radio Frequency) amplifiers such as those used in signal boosters for cellular devices (cell phones, PDAs, etc.), such amplified noise can be especially problematic. Amplified thermal noise can increase the noise floor of base stations and in so doing it can mask weaker signals thereby precluding the base stations from communicating with base stations (and with other subscribers or devices communicating through base stations).

There is therefore a need for amplifiers that can enable devices to communicate in an RF network while reducing or minimizing the impact of the amplifiers on the network itself.

SUMMARY

Embodiments of the invention relate to systems and methods for reducing noise in an amplifier or in an amplification system such as a booster amplifier. Embodiments of the invention reduce noise in a radio frequency (RF) system, such as amplified noise generated by an amplifier operating in the RF system, by controlling aspects of the amplifier. Embodiments of the invention detect whether or not an RF amplifier is actually being used to amplify useful or desirable signals. When embodiments detect that no useful or desirable signals are present, the amplifier can be turned off or the gain of the amplifier can be reduced so that the amplifier does not interfere with other users of the radio spectrum (e.g. cellular base stations). In one embodiment, a method for controlling an output of an amplifier to reduce an effect of amplified noise or a noise floor of a base station in a wireless network is provided. The method sampling an input to the booster amplifier. The input can be sampled at an output of a preamplifier or at another amplification stage. The method then determines whether a desirable signal is present at the input of the booster amplifier based on the samples. The method then controls an output of the amplifier according to the sampled input.

In another example, an amplifier for reducing an effect of amplified thermal noise in a wireless system is provided. The amplifier includes a preamplifier that receives an input and provides an output. A broadband detector samples the output of the preamplifier (and/or at another location in the amplifier) and generates a DC level for each sample. Control circuitry determines whether a desirable signal is present in the input by comparing each sample (or at least one or more of the samples) with at least one value stored in a memory. An amplifier chain, which may include one or more amplifiers, is controlled according to the determination of whether the desirable signal is present in the input to the amplifier. The samples can be compared to one or more stored values, an average of stored values, or another analysis of the stored values.

In another example, an amplifier for reducing an effect of amplified thermal noise in a wireless system is provided. The amplifier, which may be a booster amplifier, includes a preamplifier that receives an input and an amplifier chain including one or more amplifiers. The input, which includes a signal amplified by the preamplifier and the amplifier chain, is amplified such that the amplifier chain generates an output of the amplifier. The output is transmitted in the wireless network. A broadband detector takes one or more samples of the signal being amplified at any point in the amplifier from an output of the preamplifier to the output of the amplifier chain and generates a DC level for each sample. Control circuitry determines whether a desirable signal is present in the input by comparing each sample or an analysis of multiple samples with at least one value stored in a memory or an analysis (e.g., average) of the values stored in the memory. A switching circuit may be configured to shut off the amplifier or reduce a gain of the amplifier according to the determination of whether the desirable signal is present in the input.

These and other advantages and features of the present invention will become more fully apparent from the following description and appended claims, or may be learned by the practice of the invention as set forth hereinafter.

BRIEF DESCRIPTION OF THE DRAWINGS

To further clarify at least some of the advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Embodiments of the invention relate generally to systems and methods for reducing noise in an amplifier or in an amplification system such as a booster amplifier. Embodiments of the invention reduce noise in a radio frequency (RF) system, such as amplified noise generated by an amplifier operating in the RF system, by controlling aspects of the amplifier.

For example, embodiments of the invention detect whether or not an RF amplifier is actually being used to amplify useful or desirable signals. When embodiments detect that no useful or desirable signals are present or that undesirable or other signals that do not carry data (e.g., voice signals, data signals) are not present, the amplifier can be turned off or the gain of the amplifier can be reduced so that the amplifier does not interfere with other users of the radio spectrum (e.g. cellular base stations).

A properly functioning amplifier (also referred to herein as a booster amplifier) should be transparent to the cellular system in which the amplifier is operating such that base stations do not perceive any significant differences for either the case of a cell phone communicating by itself, or a cell phone (or other wireless device) communicating through the amplifier. Additionally, any emissions from the amplifier should always be within limits acceptable to cellular systems, even without a cell phone communicating through the amplifier.

Embodiments of the invention may be discussed with reference to a cell phone operating in a cellular network and transmitting voice, data, lossy or lossless signals, or combination thereof, although embodiments are applicable to other RF networks and/or other devices or other useful signals operating in RF networks.

One of skill in the art, with the benefit of the present disclosure, can appreciate that embodiments of the invention can be used with or included in other devices operating in a wireless network. Exemplary devices include, by way of example only, cell phones, personal digital assistants, smart phones, laptop computers, modems, or other network enabled devices. Wireless networks include cellular networks as well as other wireless networks.

"Cell site" and "base station" are used herein interchangeably. Cell site and base station refer to the systems and/or locations where the wireless network antenna and communications equipment is placed. The wireless network typically has many base stations in operation. A base station typically includes a transmitter/receiver, antenna tower, transmission radios and radio controllers for maintaining communications with wireless devices within a given range.

Embodiments of the amplifier, for example, may amplify signals for one or more devices (e.g., cell phones) in communication with one or more base stations. Embodiments of the invention relate to amplifiers, including booster amplifiers, that enhance the ability of a device such as a cellular telephone (or other device configured to communicate over a wireless network) to communicate in a wireless network. Embodiments extend to a booster amplifier that adjusts the gain, dynamically in some embodiments, that is applied to a wireless signal such as a cellular or other wireless signal. Embodiments of the invention also aid in reducing the noise floor of base stations by reducing the amplification of noise including thermal noise, particularly when the booster amplifier is not amplifying useful or desirable signals.

Figure 1:
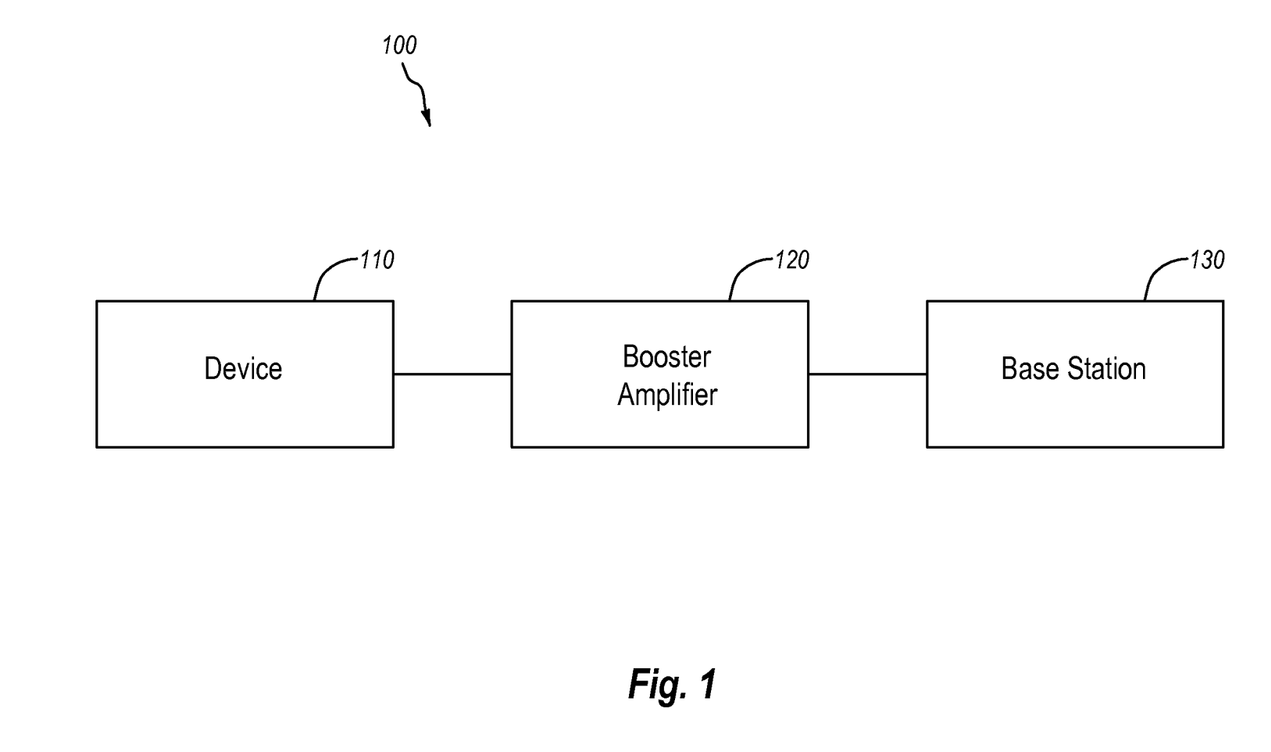
FIG. 1 illustrates an example of a device that communicates with a base station using an amplifier.

FIG. 1 generally illustrates a system 100. The system 100 may be configured to allow wireless communication in one or more spectrums. Some portions of the system 100 may include wired connections as well. In addition, the system 100 (or components thereof) may interface and communicate with other systems, such as the Internet.

FIG. 1 illustrates a device 110 that communicates with a base station 130 using a booster amplifier 120. The base station 130 is typically one of many base stations that may be present in a wireless system such as a cellular system. Similarly, the device 110 may be one of many that is communicating with the base station 130 or with other base stations in the wireless cellular system. The device 110 may be a cell phone, smart phone, handset, computer, tablet, or other wireless (or wired) device.

The amplifier 120 typically amplifies signals received from a base station as well as signals transmitted to the base station. The amplification for these signals may be the same or different. Stated another way, the amplifier 120 can apply gains to uplink signals that are different from gains applied to downlink signals.

The amplifier 120 typically communicates wirelessly with the base station 130. The communication between the device 110 and the amplifier 120 can be via a wireless connection or a wired connection. The booster amplifier 120 may include one or more antennas that enable communication between the device 110 and the base station 130.

During operation, the amplifier 120 can dynamically amplify signals transmitted to the base station 130 as well as signals received from the base station 130. The gain applied to the signals being amplified can be dynamically adjusted over time and in accordance with various factors. For example, the gain may be set to account for or to mitigate potential issues that may arise in the wireless environment. The amplifier 120 may be configured to prevent the amplifier itself from interfering with the operation of the cellular system 100 or of the base station 130 or of other devices operating in the system 100 or with other wireless systems that may be in operation.

For example, embodiments of the invention consider parameters that may have an impact on the operation of the amplifier 120 when setting the amplifier's gain. Embodiments of the invention contemplate situations where the amplifier 120 is not being used or when desirable signals are not being transmitted and/or received. More specifically, the amplifier 120 may broadcast amplified noise when not in use and embodiments of the invention control the amplifier 120 to reduce or eliminate this effect. By way of example only, a desirable signal may be present when the device 110 is used to communicate in the system 100 or transmit/receive signals (e.g., a cellular phone call, Internet access, etc., are examples of when a desirable signal is present). When the device is idle or not be being used are examples of when a desirable signal is not present at the input to the booster amplifier 120.

The amplifier includes circuitry, modules and/or components (e.g., hardware, software, firmware, etc.) that determine an optimum gain or optimum configuration (including off) under various circumstances. The amplifier 120 can be configured, for example, to reduce or eliminate the gain applied by the amplifier 120 when a desirable signal is not present at the input to the amplifier 120.

Figure 2:
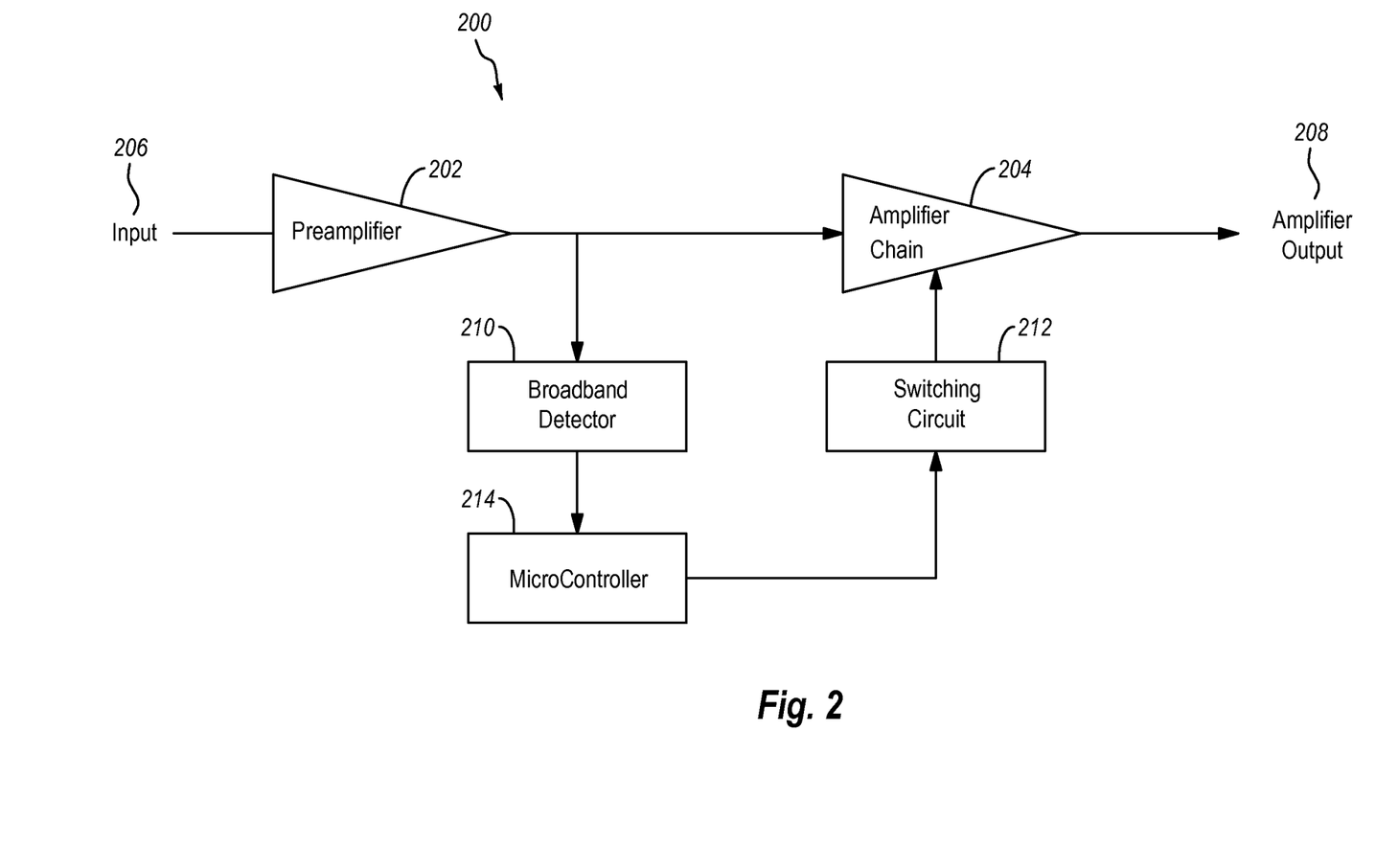
FIG. 2 illustrates an example of an amplifier.

FIG. 2 generally illustrates an embodiment of a booster amplifier 200, which is an example of the amplifier 120. The amplifier 200 may include one or more stages (e.g., amplifier stages) and may be configured to amplify signals transmitted to the base station as well as received from the base station. When embodiments of the invention operate in the uplink path and the downlink path, the circuitry can be adapted to account for the signal path. For example, one amplifier (or set of amplifiers) may amplify in the uplink direction while another amplifier (or set of amplifiers) may be used to amplify in the other direction. The uplink path and the downlink path can be separated inside the amplifier 200 such that uplink transmissions do not interfere with downlink transmissions. Some components can be shared, such as a microcontroller (or other circuitry configured to provide similar functionality), that has the ability to control amplification in either direction. Suitable hardware may be provided in order to route these signals as necessary within the amplifier 200.

In this example, an input 206 is provided to a preamplifier 202. An output of the preamplifier 202 usually includes amplified input signals (examples of desired signals) and amplified thermal noise such as amplified broadband thermal noise. By way of example only, in the 800 MHz Cellular band, the uplink bandwidth would be at least from 824 to 849 MHz, and in the 1900 MHz PCS band, the uplink bandwidth would be at least from 1850 to 1910 MHz. The uplink and/or downlink transmissions may occur in other bands or in other frequency ranges.

The output of the preamplifier 202 is applied to the broadband detector 210. The broadband detector 210 may be configured to operate with specific frequencies (e.g., the cellular band). Further, the preamplifier 202 may include a filter that restricts or controls which frequencies or bands are passed.

The output of the broadband detector 210 may be a DC level that has different values depending on whether or not a desirable signal is present in a passband of the preamplifier 202. For example, when the device 110 is in use, the device 110 is transmitting signals (e.g., voice and/or data) in the cellular band. As a result, the DC level is likely to be different from instances where the device 110 is not transmitting signals that correspond to use of the device 110. As a result, the DC level can be used to determine whether or not a desirable signal is present at the input 206 to the preamplifier 202. By monitoring the DC level(s) of the output of the preamplifier 202 (or of another stage of the amplifier), the booster amplifier 200 can determine whether a desirable signal is present in the input. For example, the input to the amplifier can be sampled by sampling the output of the preamplifier 202.

The DC level output from the broadband detector 210 that corresponds to a desirable signal can be determined in various ways. Previous measurements of the DC level can be used to determine threshold levels. When the DC level exceeds the threshold level, a desirable signal is present. Alternatively or in addition, the DC levels of a particular device can also be stored and used to determine when a desirable signal should be amplified. In other words, the history of DC levels for a particular device or group of similar or asimilar devices can be used to determine whether the currently sampled DC level is indicative of a desirable signal at the input. In one example the multiple samples are taken and the resulting DC values can be stored in a memory. A group of the samples can then be evaluated or analyzed to determine whether a desirable signal is being amplified.

The history of DC values can be maintained for one or more devices, or for specific devices (each phone model may be associated with a certain or expected DC level), or the like. In addition, usage patterns of the device that correspond to actions that may or may not actively involve a user can be considered in determining whether a desirable signal is present in the input. Automatic device updates, data pushes, or the like are examples of desirable signals that may not be dependent on user action.

If a desirable signal is determined to not be present and the amplifier is shut off or the gain is substantially reduced, embodiments of the invention are able to quickly adapt the booster amplifier 200 such that service is not affected. The user may not be aware of the operations conducted by the amplifier 200 to prevent the amplification of noise such as broadband noise.

In this example, the DC level output from the broadband detector 210 is provided to a microcontroller 214. In one example, the microcontroller 214 regularly samples the DC level output by the broadband detector 210 and compares the sampled output with previous samples of the output of the broadband detector 210. Alternatively, the microcontroller 214 (or equivalent circuitry) compares the output to a threshold DC level. The output may be a composite or average of many samples in one example.

The microcontroller 214 may maintain a history of present and past DC levels (for example in a memory available to the microcontroller 214). The current output of the broadband detector 210, in light of the history of present and/or past DC levels, enables the microcontroller 214 to determine whether or not a desirable signal is present at the input. The current output of the broadband detector 210 or an analysis of multiple samples (e.g., an average), for example, may be compared to one of more of the values in the history of DC levels to determine if a desirable signal is present at the input 206. As previously stated, the microcontroller 215 may be able to account for phone models or makes.

The output of the microcontroller 214 may be a command to a switching circuit 212 that turns the amplifier 204 (which may be an amplifier chain or other amplification arrangement) on when a desirable signal is determined to be present at the input 206. This enables the amplifier 204 to generate an amplified output 208. When a desirable signal is not detected or determined to be present at the input 206, the switching circuit 212 is controlled to turn the amplifier 204 off or ensure that the gain of the chain amplifier 204 is reduced. Alternatively stated, the output of the switching circuit 212 determines whether the chain amplifier 204 is on or off or if the gain is reduced. The switching circuit 212 may also reduce the gain of the chain amplifier 204 significantly when a desirable signal is not present at the input 206 without turning the amplifier 204 completely off.

The output of the preamplifier 202 can be sampled at any rate that is desirable, but typically at a rate that ensures that the amplifier 200 is available when needed for use. For example, when a user initiates usage of a device, a broadband signal is generated and transmitted by the device and is thus included in the input received at the device. The broadband detector 210 outputs a DC level and the microcontroller 214 determines that a desirable signal is present at the input 206. The microcontroller 214 causes the switching circuit 212 to provide an output that turns the amplifier 204 on or increases the gain. In one embodiment, the amplifier 204 is able to operate normally when a desirable signal is detected. Normal operation may allow other modules included in the amplifier 200 to dynamically adjust the gain. In one embodiment, the ability of other modules to dynamically adjust the gain of the amplifier 204 may be restricted or reduced when the output of the switching circuit 212 indicates that the amplifier 204 is off or has reduced gain.

For example, when the booster amplifier 200 is operating normally, the gain of the amplifier may be altered or varied for other reasons in order to mitigate against other issues that may occur when operating the booster amplifier 200 in a wireless system or network. The gain may be controlled to mitigate the impact of the amplifier on noise floor control even when the amplifier is on because a desirable signal is present. In one embodiment, the amplifier 200 thus includes one or more layers of controls that enable the amplifier to mitigate potentially adverse effects of signal and/or noise amplification.

Figure 3:
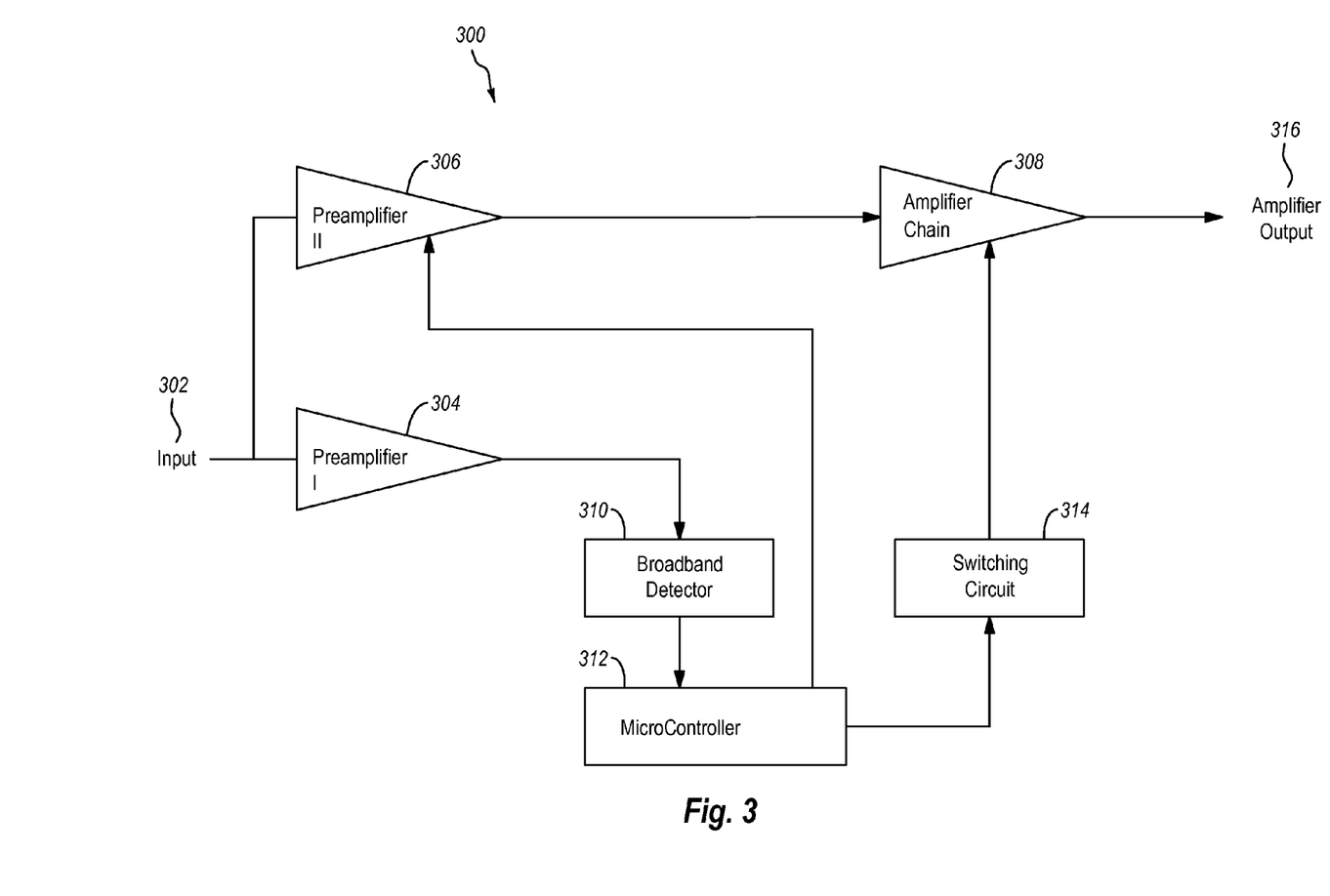
FIG. 3 illustrates another example of an amplifier configured to reduce noise in a network.

FIG. 3 illustrates another embodiment of the invention. FIG. 3 illustrates an example of a booster amplifier 300, which is an example of the booster amplifier 120. In this example, the booster amplifier 300 includes a preamplifier 304 and a preamplifier 306, both of which receive an input 302.

An output of the preamplifier 304 includes amplified input signals (when present) and amplified broadband thermal noise or other noise. An output of the preamplifier 304 is applied to the broadband detector 310. An output of the broadband detector is a DC level that has different values depending upon whether or not a signal is present in the passband of the preamplifier 304 as previously described. The DC level from the broadband detector 310 is an input to a microcontroller 312.

The microcontroller 312 dynamically controls a gain of the preamplifier 306 (based upon various considerations and algorithms). In consideration of the present (e.g., currently sampled DC levels) and past DC levels, which may be stored in a memory, from the broadband detector 310, the gain of the preamplifier 306 and other parameters that are presented to the microcontroller 312, the microcontroller 312 determines whether or not a desirable signal is present at the input 302, and whether or not an excessive amount of noise could appear at the output of a final amplifier 308 (which may be an amplifier chain or other amplifier arrangement) if the amplifier 308 were switched on or if the gain were increased.

If a desirable signal is determined to be present at the input 302, the microcontroller 312 sends a command to the switching circuit 314 that fully turns on the final amplifier (or other preceding stage) in the amplifier chain 308 (the gain may still be adjusted dynamically by other modules of the amplifier). If a desirable signal is not present and/or noise output would be excessive at the output of the final amplifier 308, the amplifier 308 has reduced gain because the microcontroller 312 sends a command to the switching circuit 314 that turns off the amplifier 308 or that restricts gain of the amplifier 308. The reduced gain can be controlled by using the switching circuit 314 to turn the amplifier 308 off or to control a gain applied to the final amplifier 308 (and/or other amplification stages of the booster amplifier 300). When the amplifier 308 includes one or more amplifiers or an amplifier chain, the switching circuit 314 can control any (or more) amplifier in the amplifier chain including the final amplifier.

As discussed herein, embodiments of the invention can reduce the effect of amplified noise, including amplified broadband thermal noise) on a wireless system. The amplifier is controlled by determining whether a desirable signal is being transmitted (or received). When the amplifier is being used to amplify a desirable signal, the amplifier is enabled to operate normally. When the amplifier is not amplifying a desirable signal, the gain is reduced or eliminated. This can advantageously reduce the impact of the amplifier on at least the noise floor of a base station, for example.

The amplifier 200 or 300 may also include, for example, a variable attenuator and/or a variable gain amplifier in the amplifier chain. The switching circuit or the microcontroller can operate to control the gain (e.g., reduce the gain or turn the amplifier off) of the amplifier via the variable gain amplifier or the variable attenuator. The gain can also be controlled by controlling the gain of the preamplifier. The gain can be reduced using the variable attenuator or by decreasing the bias voltage to the amplifier chain, or by other methods known to one of skill in the art.

Figure 4:
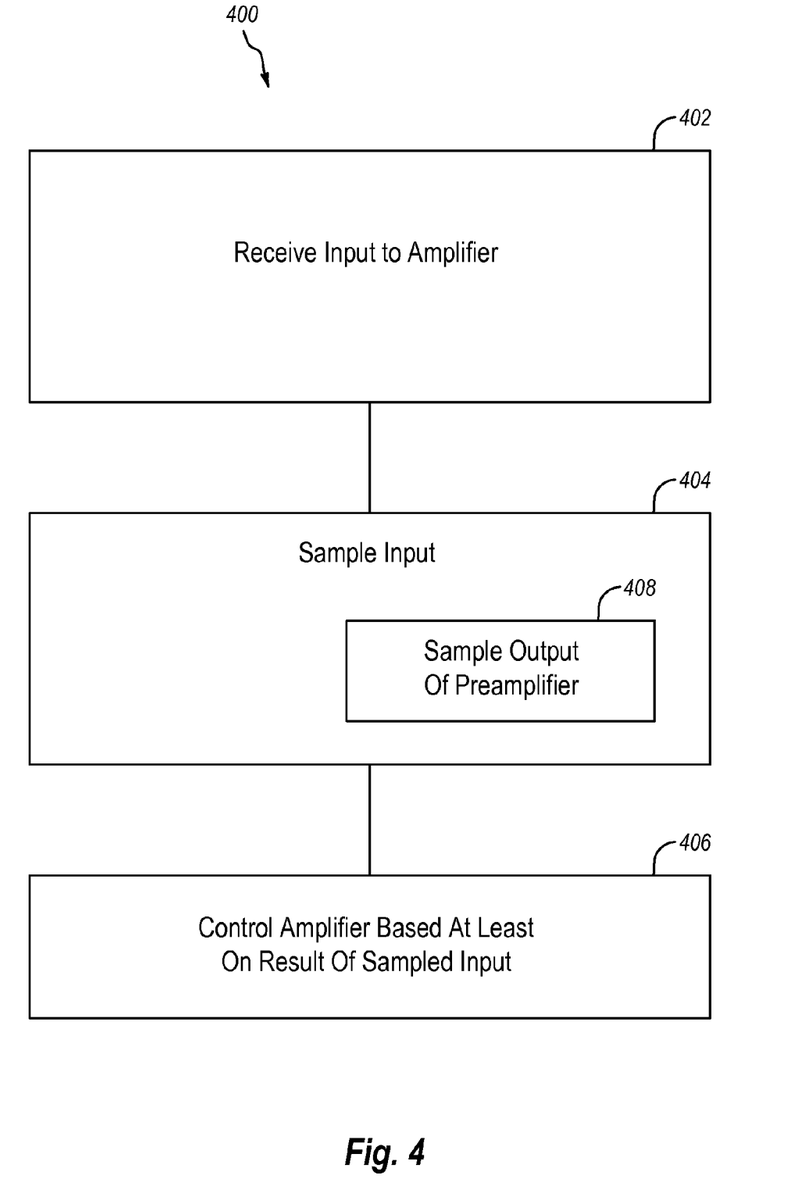
FIG. 4 illustrates an example method for reducing amplifier noise.

FIG. 4 illustrates an exemplary method for reducing amplifier noise. For example, amplified broadband thermal noise can impact at least a noise floor of a base station. A method 400 for reducing amplifier noise may begin by receiving 402 an input to an amplifier. Often, the input is received at a first amplification stage or at a preamplifier. However, when an input is not being received and the output of the amplifier corresponds to amplified noise, the method may begin by sampling the input.

The method then samples 404 the input, for example by sampling 408 an output of a preamplifier. In other words, the input (which may include a desirable signal or which may not include a desirable signal) is sampled by sampling the output of the preamplifier or the output of another amplification stage. Often the input is sampled after the first amplification stage or after preamplification. The method then controls 406 the amplifier based at least on a result of the sampled input or based on an analysis of multiple samples. The sampled input, when sampled at the output of the preamplifier, has a DC level. The DC level of the input is different when a desirable signal is received compared to when the desirable signal is not received at the input.

Thus, the amplifier determines whether a desirable signal is present at the input. More specifically, control circuitry or a microcontroller can compare the DC level to present and/or historical values of the DC level to determine whether a desirable signal is present. The final amplification of the signal is then controlled. For example, the final amplifier is turned off or the gain is substantially reduced. As a result, the impact of amplified thermal noise is reduced when a desirable signal is not present.

In one embodiment, the microcontroller can use a sample and hold arrangement to control the final amplification. When the DC level indicates that a desirable signal is not present (by sampling the DC level), a switching circuit is held at a level that turns the amplifier off or that reduces or restricts the gain of the amplifier.

In another embodiment, the decision of whether to turn the amplifier off or to substantially reduce the gain such that the noise does not affect the noise floor of the base station is made based on the likely impact of the amplifier on the noise floor. In this case, the DC level, a gain of a preamplifier, the likely amount of noise appearing at the output of the booster amplifier if switched on or if allowed to operate normally, and/or other factors may be used to determine how to control the amplifier or to determine whether a desirable signal is present at the input.

The embodiments of the present invention may comprise a special purpose or general-purpose computing device including various computer hardware. The control circuit or other processor included in embodiments of the amplifier are examples of a computing device.

Embodiments within the scope of the present invention also include computer-readable media for carrying or having computer-executable instructions or data structures stored thereon. Such computer-readable media can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. Combinations of the above should also be included within the scope of computer-readable media. Computer-executable instructions comprise, for example, instructions and data which cause a general purpose computer, special purpose computer, or special purpose processing device to perform a certain function or group of functions.

The following discussion is intended to provide a brief, general description of a suitable computing environment in which the invention may be implemented. Although not required, the invention will be described in the general context of computer-executable instructions, such as program modules, being executed by computers in network environments. Generally, program modules include routines, programs, objects, components, data structures, etc. that perform particular tasks or implement particular abstract data types. Computer-executable instructions, associated data structures, and program modules represent examples of the program code means for executing steps of the methods disclosed herein. The particular sequence of such executable instructions or associated data structures represents examples of corresponding acts for implementing the functions described in such steps.

Those skilled in the art will appreciate that the invention may be practiced in network computing environments with many types of computer system configurations, including personal computers, hand-held devices, multi-processor systems, microprocessor-based or programmable consumer electronics, network PCs, minicomputers, mainframe computers, and the like. The invention may also be practiced in distributed computing environments where tasks are performed by local and remote processing devices that are linked (either by hardwired links, wireless links, or by a combination of hardwired or wireless links) through a communications network. In a distributed computing environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A booster amplifier to reduce an effect of amplified thermal noise in a wireless network, the booster amplifier comprising:
    a first preamplifier that receives a first input and provides a first output;
    an amplifier chain including one or more amplifiers, wherein an input to the amplifier chain includes the first output of the first preamplifier and the amplifier chain generates an output of the booster amplifier that is transmitted in the wireless network;
    a second preamplifier that receives the first input and provides a second output, wherein the second preamplifier is not located in a signal path coupled to the output of the booster amplifier;
    a broadband detector that takes samples of the second output of the second preamplifier and that generates a DC level for each sample;
    a memory that stores the DC levels of a first plurality of samples previously taken by the broadband detector; and
    control circuitry that determines whether a data signal is present at an input of the booster amplifier by comparing an analysis of the DC levels of a second plurality of samples taken by the broadband detector with an analysis of the DC levels of the first plurality of samples previously taken by the broadband detector and stored in the memory, wherein the control circuitry directs that a gain of the first preamplifier or one or more of the one or more amplifiers of the amplifier chain be decreased when the data signal is determined to not be present at the input of the booster amplifier.

2. The booster amplifier of claim 1, wherein the data signal is received directly from a base station or a wireless device in the wireless network.

3. The booster amplifier of claim 1, further comprising a switching circuit that decreases the gain of the one or more of the one or more amplifiers of the amplifier chain when the data signal is determined to not be present at the input of the booster amplifier.

4. The booster amplifier of claim 1, wherein the control circuitry directs that the gain of the first preamplifier and that the gain of the one or more of the one or more amplifiers of the amplifier chain be decreased when the data signal is determined to not be present at the input of the booster amplifier.

* * * * *